United States Patent [19]

Jang et al.

[11] Patent Number: 5,674,783
[45] Date of Patent: Oct. 7, 1997

[54] METHOD FOR IMPROVING THE CHEMICAL-MECHANICAL POLISH (CMP) UNIFORMITY OF INSULATOR LAYERS

[75] Inventors: Syun-Ming Jang; Chen-Hua Douglas Yu, both of Hsiu-chu, Taiwan

[73] Assignee: Taiwan Semiconductor Manufacturing Company, Ltd., Hsin-chu, Taiwan

[21] Appl. No.: 625,278

[22] Filed: Apr. 1, 1996

[51] Int. Cl.⁶ .................................................. H01L 21/316
[52] U.S. Cl. ...................... 437/195; 437/228; 437/235; 437/238; 156/636.1
[58] Field of Search .................................. 437/195, 228, 437/228 PL, 235, 238; 156/636.1, 662.1

[56] References Cited

U.S. PATENT DOCUMENTS

| | | | |
|---|---|---|---|
| 5,342,808 | 8/1994 | Brigham et al. | 437/228 |
| 5,399,389 | 3/1995 | Hieber et al. | 437/238 |
| 5,420,075 | 5/1995 | Homma et al. | 437/195 |
| 5,424,253 | 6/1995 | Usami et al. | 437/238 |
| 5,444,023 | 8/1995 | Hamma | 437/195 |
| 5,489,553 | 2/1996 | Cheu | 437/195 |
| 5,536,681 | 7/1996 | Jang et al. | 437/195 |
| 5,607,880 | 3/1997 | Suzuki et al. | 437/228 |

FOREIGN PATENT DOCUMENTS

| | | |
|---|---|---|
| 407263441 | 10/1995 | Japan . |
| 408186170 | 7/1996 | Japan . |

*Primary Examiner*—Charles L. Bowers, Jr.
*Assistant Examiner*—Matthew Whipple
*Attorney, Agent, or Firm*—George O. Saile; Stephen B. Ackerman; Alek P. Szecsy

[57] ABSTRACT

A method for forming an insulator layer with enhanced uniformity when planarized through a Chemical-Mechanical Polish (CMP) planarizing process. There is first provided a semiconductor substrate having formed thereupon a patterned layer. The patterned layer has a volume density greater than the volume density of an insulator layer to be formed upon the patterned layer. The patterned layer also has a first region having a high areal density of the patterned layer and a second region having a low areal density of the patterned layer. The second region of the patterned layer is then masked. The first region of the patterned layer is then exposed to a first plasma which is capable of modifying the first region of the patterned layer such that the insulator layer will form less rapidly upon the first region of the patterned layer than upon the second region of the patterned layer. The second region of the semiconductor substrate is then unmasked and the insulator layer is formed upon the patterned layer. The insulator layer so formed being thicker over the second region than over the first region. As a first alternative the first region of the patterned layer may be masked and the second region of the patterned layer exposed to a second plasma which enhances the growth of the insulator layer. As a second alternative, both the first plasma and the second plasma may be employed through sequential masking steps.

25 Claims, 8 Drawing Sheets

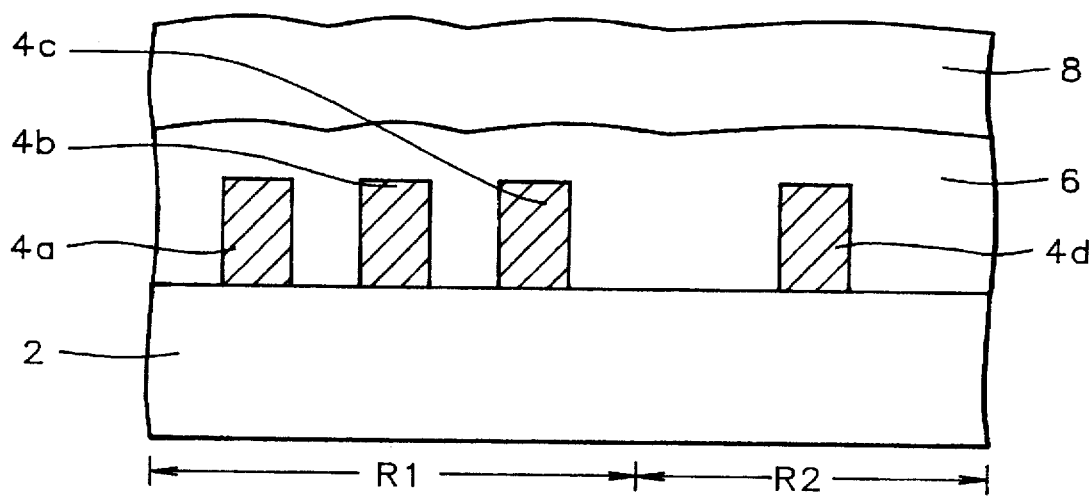
*FIG. 1 - Prior Art*
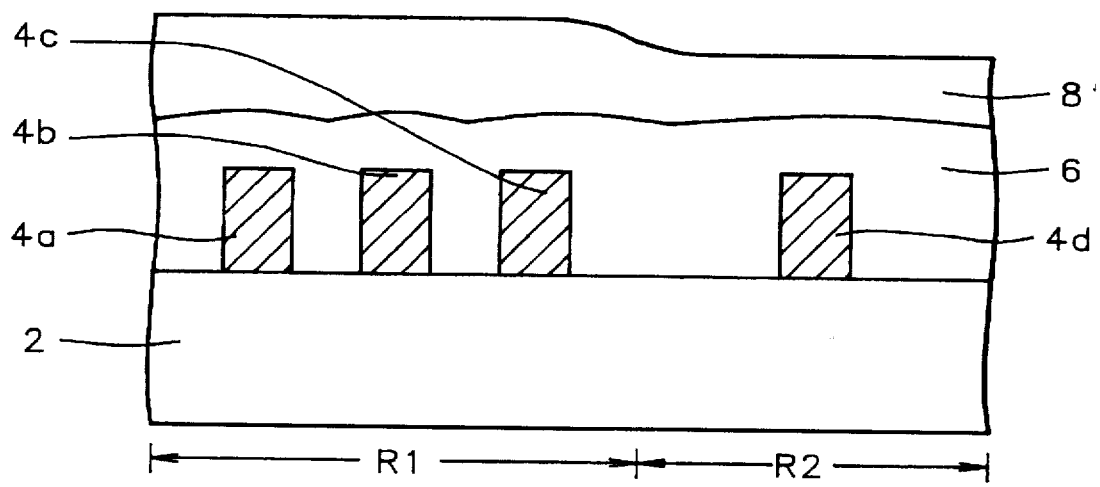
*FIG. 2 - Prior Art*

METHOD FOR IMPROVING THE CHEMICAL-MECHANICAL POLISH (CMP) UNIFORMITY OF INSULATOR LAYERS

BACKGROUND OF THE INVENTION

1. Field of the Invention

The present invention relates generally to insulator layers within integrated circuits. More particularly, the present invention relates to methods for improving the Chemical-Mechanical Polish (CMP) uniformity of insulator layers within integrated circuits.

2. Description of the Related Art

As integrated circuit technology has advanced, integrated circuit device and conductor element dimensions have continually decreased while aspect ratios of conductor elements which interconnect those integrated circuit devices have continually increased. Thus, it has become increasingly more important within advanced integrated circuits to provide manufacturable and reliable methods for connecting: (1) high aspect ratio conductors with other high aspect ratio conductors within those integrated circuits, and (2) high aspect ratio conductors with narrow line-width integrated circuit devices within those integrated circuits.

Of the methods for interconnecting high aspect ratio conductors within advanced integrated circuits and connecting high aspect ratio conductors with narrow line-width integrated circuit devices within advanced integrated circuits, methods involving the formation of interconnection studs or contact studs within planarized insulator layers have gained the most wide acceptance. Such methods typically first provide that an insulator layer is formed upon a semiconductor substrate, the semiconductor substrate having formed upon its surface high aspect ratio conductors and/or narrow line-width integrated circuit devices to which interconnections and/or connections are desired. The entire surface of the insulator layer is then planarized prior to etching through the planarized insulator layer vias into which are subsequently formed conductive interconnection studs or conductive contact studs. The planarizing may be accomplished through methods including but not limited to Reactive Ion Etch (RIE) etch-back planarizing methods and Chemical-Mechanical Polish (CMP) planarizing methods.

Due to its potential for providing planarized insulator layers encompassing a wide variety of insulator materials and process conditions, Chemical-Mechanical Polish (CMP) planarizing methods have gained wide acceptance in planarizing insulator layers within integrated circuits. Chemical-Mechanical Polish (CMP) planarizing methods are not, however, without limitations. In particular, it is known in the art that several factors influence the uniformity of planarized insulator layers which have been planarized through the Chemical-Mechanical Polish (CMP) method. Of these factors, a first factor is the mechanical characteristics of the substrate layers residing beneath the insulator layer desired to be planarized. In general, substrate layers of high volume density will retard Chemical-Mechanical Polish (CMP) planarizing rates of insulator layers residing upon those high volume density substrate layers. In addition, a second factor is the areal density of the substrate layer upon which is formed the insulator layer desired to be planarized. In general, a high areal density of a high volume density substrate layer will further retard Chemical-Mechanical Polish (CMP) rates of insulator layers formed upon those high areal density and high volume density substrate layers.

The disparity in Chemical-Mechanical Polish (CMP) planarization rates exhibited by insulator layers as a function of areal densities and volume densities of substrate layers which underlie those insulator layers presents genuine problems in forming integrated circuits having uniformly planarized insulator layers across their entire widths. An integrated circuit structure which demonstrates this problem is illustrated by reference to FIG. 1 and FIG. 2.

Shown in FIG. 1 is a substrate layer 2, upon which resides high volume density patterned layers 4a, 4b, 4c and 4d, which are typically patterned conductor layers. The first three high volume density patterned layers 4a, 4b and 4c reside in high areal density region R1 of the high volume density patterned layers 4a, 4b, 4c and 4d. The remaining high volume density patterned layer 4d resides in low areal density region R2 of the high volume density patterned layers 4a, 4b, 4c and 4d. Formed upon the substrate layer 2 and the high volume density patterned layers 4a, 4b, 4c and 4d is a gap filling insulator layer 6, and formed upon the gap filling insulator layer 6 is a conformal insulator layer 8. It is the conformal insulator layer 8 which is desired to be planarized through a Chemical-Mechanical Polish (CMP) planarizing method.

Shown in FIG. 2 is the result of the Chemical-Mechanical Polish (CMP) planarizing of the conformal insulator layer 8 as illustrated in FIG. 1. Shown in FIG. 2 is the thinning of the portion of the planarized conformal insulator layer 8 which resides over the low areal density region R2, in comparison with the thicker portion of the planarized conformal insulator layer 8 which resides over the high areal density region R1. It is towards the goal of improving the Chemical-Mechanical Polish (CMP) uniformity of planarized insulator layers, such as planarized conformal insulator layer 8, that the present invention is directed.

While the non-uniform Chemical-Mechanical Polish (CMP) planarized insulator layers which result from areal density variations and volume density variations of patterned layers which underlie those insulator layers are known in the art, lesser known in the art are methods by which the non-uniformity within those Chemical-Mechanical Polish (CMP) planarized insulator layers may be minimized or eliminated. One possible method to minimize or eliminate the non-uniformity is to selectively and independently deposit an additional insulator layer above and/or below those portions of the insulator layer desired to be planarized which are expected to have the highest Chemical-Mechanical Polish (CMP) planarizing rate. While this method would compensate for localized increased planarizing rates of the insulator layer desired to be planarized, the method also provides manufacturing complexity and the formation of an additional interface within the integrated circuit.

Desirable in the art are methods whereby insulator layers within integrated circuits may be uniformly Chemical-Mechanical Polish (CMP) planarized independent of the areal density of high volume density patterned layers upon which those insulator layers are formed. Most desirable in the art are methods whereby such insulator layers may be uniformly Chemical-Mechanical Polish (CMP) planarized without need for an independently formed additional patterned insulator layer to compensate areas of the insulator layer having increased Chemical-Mechanical Polish (CMP) rates.

SUMMARY OF THE INVENTION

A first object of the present invention is to provide a method for uniformly Chemical-Mechanical Polish (CMP) planarizing an insulator layer within an integrated circuit.

the uniform Chemical-Mechanical Polish (CMP) planarizing being undertaken independent of the areal density of high volume density patterned layers upon which the insulator layer is formed.

A second object of the present invention is to provide a method in accord with the first object of the present invention, which method may be practiced without need for an independently formed additional patterned insulator layer to compensate areas of the insulator layer having increased Chemical-Mechanical Polish (CMP) rates.

A third object of the present invention is to provide a method in accord with the first object of the present invention and the second object of the present invention, which method is also manufacturable.

In accord with the objects of the present invention, there is provided a method for planarizing through a Chemical-Mechanical Polish (CMP) method, and with enhanced uniformity, an insulator layer within an integrated circuit. To practice the method of the present invention, there is first provided a semiconductor substrate having formed thereupon a patterned layer. The patterned layer has a volume density greater than the volume density of an insulator layer to be formed upon the patterned layer. The patterned layer also has a first region having a high areal density of the patterned layer and a second region having a low areal density of the patterned layer.

In a first embodiment of the method of the present invention, the second region of the patterned layer is masked. The first region of the patterned layer is then exposed to a first plasma which is capable of modifying the first region of the patterned layer such that the insulator layer will form less rapidly upon the first region of the patterned layer than upon the second region of the patterned layer. The second region of the patterned layer is then unmasked and the insulator layer is formed upon the patterned layer. The insulator layer so formed is thicker over the second region than over the first region.

In a second embodiment of the method of the present invention, the first region of the patterned layer is masked. The second region of the patterned layer is then exposed to a second plasma which is capable of modifying the second region of the patterned layer such that the insulator layer will form more rapidly upon the second region of the patterned layer than upon the first region of the patterned layer. The first region of the patterned layer is then unmasked and the insulator layer is formed upon the patterned layer. The insulator layer so formed is thicker over the second region than over the first region.

In a third embodiment of the method of the present invention, the first embodiment of the method of the present invention and the second embodiment of the method of the present invention are combined to yield a patterned layer whose first region is treated with a first plasma and whose second region is treated with a second plasma. The patterned layer so treated yields a patterned layer upon which the insulator layer forms much more rapidly upon the second region of the patterned layer than the first region of the patterned layer, in comparison with the first embodiment of the present invention or the second embodiment of the present invention.

The present invention provides a method for forming an insulator layer within an integrated circuit, which insulator layer may be uniformly Chemical-Mechanical Polish (CMP) planarized independent of the areal density of a high volume density patterned layer upon which the insulator layer is formed. Through the first plasma treatment and/or the second plasma treatment of the method of the present invention there is provided a high volume density patterned layer upon which is formed an insulator layer having: (1) a greater thickness over a low areal density area of the high volume density patterned layer, and (2) a lesser thickness over a high areal density area of the high volume density patterned layer. Due to the different thicknesses of the insulator layer, and the corresponding differences in Chemical-Mechanical Polish (CMP) planarizing rates of the insulator layer, the insulator layer may be uniformly Chemical-Mechanical Polish (CMP) planarized independent of the areal density of a high volume density patterned layer upon which the insulator layer is formed.

The method of the present invention may be practiced without need for an independently formed additional patterned insulator layer to compensate areas of the insulator layer having increased Chemical-Mechanical Polish (CMP) rates. Since the method of the present invention inherently provides an insulator layer having the thickness variations needed for uniform Chemical-Mechanical Polish (CMP) planarizing of the insulator layer, no independent additional patterned insulator layers are needed to compensate for portions of the insulator layer having increased Chemical-Mechanical Polish (CMP) planarizing rates.

The method of the present invention is readily manufacturable. Although the specific methods and materials through which are formed the uniformly Chemical-Mechanical Polish (CMP) planarized insulator layers of the present invention are not commonly known in the art, methods and materials through which insulator layers in general may be formed and modified within integrated circuits are known in the art. Such methods and materials are employed within the method of the present invention, and such methods are readily manufacturable.

BRIEF DESCRIPTION OF THE DRAWINGS

The following drawings, which form a material part of this disclosure, show the following:

FIG. 1 and FIG. 2 show a pair of schematic cross-sectional diagrams illustrating non-uniform Chemical-Mechanical Polish (CMP) planarizing of insulator layers through a method of the prior art.

DESCRIPTION OF THE PREFERRED EMBODIMENTS

The present invention provides a method for forming within an integrated circuit an insulator layer which may be uniformly Chemical-Mechanical Polish (CMP) planarized independent of the areal density of a high volume density patterned layer residing beneath the insulator layer. The method through which is formed the insulator layer of the present invention does not involve forming upon and/or beneath the insulator layer an additional independent patterned insulator layer to compensate for Chemical-Mechanical Polish (CMP) planarizing rate differences of the insulator layer which correlate with the areal density of the high volume density patterned layer residing beneath the insulator layer.

The method through which is formed the uniformly Chemical-Mechanical Polish (CMP) planarized insulator layer of the present invention involves: (1) treatment of high areal density portions of the high volume density patterned layer with a plasma which inhibits the growth of the insulator layer upon those portions of the high volume density patterned layer, and/or (2) treatment of low areal density portions of the high volume density patterned layer with a plasma which promotes the growth of the insulator layer upon those portions of the high volume density patterned layer. The specific plasmas which may be employed to treat the high areal density and the low areal density regions of the patterned layer, as well as the process parameters under which those plasmas are employed, have been determined experimentally and are disclosed within the preferred embodiments of the method of the present invention.

The method of the present invention may be employed in forming insulator layers which may be uniformly Chemical-Mechanical Polish (CMP) planarized within various types of integrated circuits. The method of the present invention may be employed in forming uniformly Chemical-Mechanical Polish (CMP) planarized insulator layers within integrated circuits including but not limited to Dynamic Random Access Memory (DRAM) integrated circuits, Static Random Access Memory (SRAM) integrated circuits, Application Specific Integrated Circuits (ASICs), integrated circuits having within their fabrications Metal Oxide Semiconductor Field Effect Transistors (MOSFETs), integrated circuits having within their fabrications bipolar transistors and integrated circuits having within their fabrications Bipolar Complementary Metal Oxide Semiconductor (BiCMOS) transistors.

Figure 3:
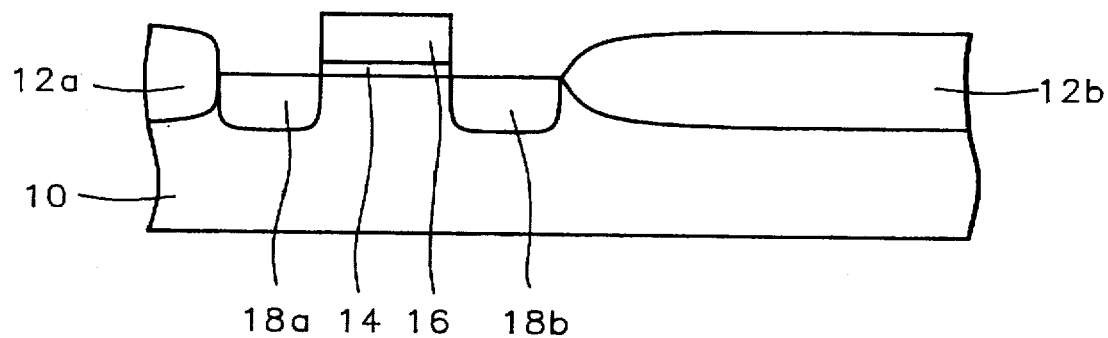
FIG. 3 to FIG. 8 show a series of schematic cross-sectional diagrams illustrating progressive stages in forming an integrated circuit into which are formed multiple uniformly Chemical-Mechanical Polish (CMP) planarized insulator layers through the first preferred embodiment of the method of the present invention.

Referring now to FIG. 3 to FIG. 7 there is shown a series of cross-sectional schematic diagrams illustrating the results of progressive process steps in forming a uniformly Chemical-Mechanical Polish (CMP) planarized insulator layer within an integrated circuit through the first preferred embodiment of the method of the present invention. Shown in FIG. 3 are the results of the early process steps in forming the integrated circuit.

Shown in FIG. 3 is a semiconductor substrate 10 upon and within whose surface there are formed isolation regions 12a and 12b. Semiconductor substrates upon which the present invention may be practiced may be formed with either dopant polarity, any dopant concentration and any crystallographic orientation. Typically, the semiconductor substrate 10 upon which is practiced the present invention is a N- or P-silicon semiconductor substrate having a (100) crystallographic orientation.

Methods by which isolation regions may be formed within and upon semiconductor substrates are known in the art. Such methods include but are not limited to methods whereby a portion of a semiconductor exposed through an appropriate mask is oxidized to form isolation regions within and upon the semiconductor substrate, and methods whereby a separate insulating layer is formed upon a semiconductor substrate surface and subsequently patterned to form isolation regions upon the semiconductor substrate. For the first preferred embodiment of the method of the present invention, the isolation regions 12a and 12b are preferably formed through a thermal oxidation process whereby portions of the semiconductor substrate 10 exposed through a suitable oxidation mask are consumed to form within and upon the semiconductor substrate 10 isolation regions 12a and 12b of silicon oxide.

Also illustrated within FIG. 3 is a gate oxide layer 14 upon which resides a gate electrode 16. Both the gate oxide layer 14 and the gate electrode 16 reside upon the active semiconductor region of the semiconductor substrate 10. Both the gate oxide layer 14 and the gate electrode 16 are components of a Metal Oxide Semiconductor Field Effect Transistor (MOSFET).

Methods and materials through which gate oxide layers and gate electrodes may be formed upon active semiconductor regions of semiconductor substrates are known in the art. Gate oxides may be formed through methods including but not limited to methods whereby the surface of the active semiconductor region of a semiconductor substrate is oxidized to form a blanket gate oxide layer upon the active semiconductor region, and methods whereby a blanket gate oxide layer is independently deposited upon the surface of the active semiconductor region. Excess portions of blanket gate oxide layers formed upon active semiconductor regions may be removed through etching processes conventional to the art.

Gate electrodes are typically formed via patterning and etching through methods as are conventional in the art of blanket layers of gate electrode materials which are formed upon the surfaces of blanket gate oxide layers. Typically, blanket layers of gate electrode materials are formed from highly conductive materials such as metals, metal alloys, highly doped polysilicon and polycides (polysilicon/metal silicide stacks).

For the first preferred embodiment of the method of the present invention, the gate oxide layer 14 is preferably formed through patterning of a blanket gate oxide layer formed through thermal oxidation of the active semiconductor region of semiconductor substrate 10 at a temperature of about 800 to about 1000 degrees centigrade to yield a typical blanket gate oxide layer thickness of about 70 to about 120 angstroms. For the first preferred embodiment of the method of the present invention, the gate electrode 16 is preferably formed by patterning and etching a blanket layer of highly doped polysilicon formed upon the blanket gate oxide layer at a thickness of about 2500 to about 3000 angstroms through a Chemical Vapor Deposition (CVD) process employing silane as the silicon source material along with suitable dopant species. Once the blanket layer of highly doped polysilicon has been patterned to yield the gate electrode 16, the gate electrode may be used as an etch mask to pattern the gate oxide layer 14 from the blanket gate oxide layer.

Finally, there is shown in FIG. 3 source/drain electrodes 18a and 18b formed within the surface of the active semiconductor region of the semiconductor substrate 10 at areas not occupied by the gate electrode 16, the gate oxide layer 14 and the isolation regions 12a and 12b. Methods and materials through which source/drain electrodes may be formed within semiconductor substrates are known in the art. Such methods typically employ dopant species which are ionized and implanted into a semiconductor substrate at sufficient velocity and dose to form into the semiconductor substrate a region of conductivity sufficient for a source/ drain electrode. The polarity desired for the source/drain electrode will dictate the polarity of the dopant species. Arsenic dopant species, boron dopant species and phosphorus dopant species are common in the art. For the first preferred embodiment of the method of the present invention, the source/drain electrodes 18a and 18b are preferably formed through implanting a suitable dopant species into the active region of the semiconductor substrate 10 at about 1E14 to about 1E16 ions per square centimeter dose and about 50 to about 150 keV ion implantation energy.

Having formed a Metal Oxide Semiconductor Field Effect Transistor (MOSFET) comprising source/drain electrodes 18a and 18b formed into the semiconductor substrate 10, and a gate electrode 16 upon a gate oxide layer 14 adjoining the source/drain electrodes, the next series of process steps in forming the uniformly Chemical-Mechanical Polish (CMP) planarized insulator layer through the first preferred embodiment of the method of the present invention may proceed. The results of those process step are illustrated by the integrated circuit whose schematic cross-sectional diagram is shown in FIG. 4.

Figure 4:
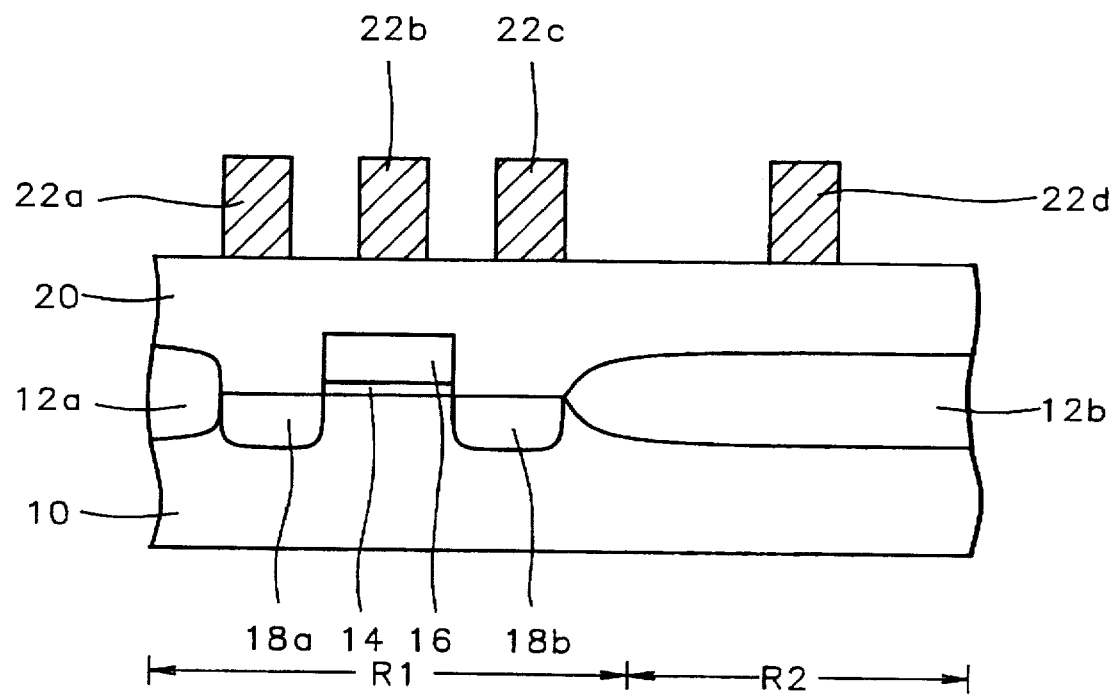

Shown in FIG. 4 is the presence of a blanket planarized Pre-Metal Dielectric (PMD) layer 20 formed upon the integrated circuit whose structure is illustrated in FIG. 3. Methods and materials through which blanket planarized Pre-Metal Dielectric (PMD) layers may be formed are known in the art of integrated circuit manufacture. Blanket planarized Pre-Metal Dielectric (PMD) layers are typically formed through planarizing through methods as are conventional in the art of blanket conformal Pre-Metal Dielectric (PMD) layers. Blanket conformal Pre-Metal Dielectric (PMD) layers may be formed of silicon oxide dielectric materials, silicon nitride dielectric materials and silicon oxynitride dielectric materials deposited upon semiconductor substrates through methods including but not limited to Chemical Vapor Deposition (CVD) methods, Plasma Enhanced Chemical Vapor Deposition (PECVD) methods and Physical Vapor Deposition (PVD) sputtering methods. For the first preferred embodiment of the method of the present invention, the blanket planarized Pre-Metal Dielectric (PMD) layer 20 is preferably formed through planarizing a conformal Pre-Metal Dielectric (PMD) layer formed from a silicon oxide dielectric material deposited upon the semiconductor substrate 10 through a Plasma Enhanced Chemical Vapor Deposition (PECVD) method, as is common in the art. The blanket planarized Pre-Metal Dielectric (PMD) layer 20 may be planarized through a Reactive Ion Etch (RIE) etchback planarizing method or a Chemical Mechanical Polish (CMP) planarizing method, as is common in the art. Typically, although not exclusively, the blanket planarized Pre-Metal Dielectric (PMD) layer 20 will not substantially benefit from the uniform Chemical Mechanical Polish (CMP) planarizing method of the present invention, since the blanket planarized Pre-Metal Dielectric (PMD) layer 20 will not typically exhibit substantial non-uniformity when planarized through a Chemical-Mechanical Polish (CMP) method.

Also shown in FIG. 4 is the presence of patterned first conductor layers 22a, 22b, 22c and 22d formed upon the surface of the blanket planarized Pre-Metal Dielectric (PMD) layer 20. Methods and materials through which patterned conductor layers may be formed within integrated circuits are known in the art. Patterned conductor layers are typically formed through patterning blanket conductor layers through photolithographic and etching methods as are known in the art. The blanket conductor layers may be formed from conductive materials including but not limited to metals, metal alloys and doped polysilicon deposited upon a semiconductor substrate through methods including but not limited to thermally assisted evaporation methods, electron beam assisted evaporation methods, Chemical Vapor Deposition (CVD) methods and Physical Vapor Deposition (PVD) sputtering methods.

For the first preferred embodiment of the method of the present invention, the patterned first conductor layers 22a, 22b, 22c and 22d are preferably formed through patterning of a blanket conductor layer formed from a tri-layer stack. The tri-layer stack preferably consists of: (1) a blanket lower barrier layer formed of a titanium nitride at a thickness of about 800 to about 1200 angstroms, (2) a blanket middle conductor layer formed of an aluminum containing alloy at a thickness of about 5000 to about 6000 angstroms, and (3) a blanket upper barrier layer formed of a titanium nitride at a thickness of about 1000 to about 1400 angstroms. As also shown in FIG. 4, the patterned first conductor layers 22a, 22b and 22c reside in a high areal density region R1 of the patterned first conductor layers 22a, 22b, 22c and 22d, while the patterned first conductor layer 22d resides in a low areal density region R2 of the patterned first conductor layers 22a, 22b, 22c and 22d.

The method of the present invention provides value in forming uniformly Chemical-Mechanical Polish (CMP) planarized insulator layers when the difference in the areal densities of the patterned layers in the high areal density region R1 and the low areal density region R2 is at least about 10 percent. Typically, the areal density of the patterned layers within the high areal density region R1 will be greater than about 50 percent and the areal density of the patterned layers within the low areal density region R2 will be less than about 30 percent.

The method of the present invention also provides value in forming a uniformly Chemical-Mechanical Polish (CMP) planarized insulator layer when there exists a substantial volume density difference between the insulator layer to be planarized and the patterned layers upon which the insulator layer resides. In practice the requisite volume density difference is obtained when the patterned layer is a patterned conductor layer within an integrated circuit and the insulator layer is a silicon oxide or a silicon nitride insulator within the integrated circuit, although other combinations of insulator layers and patterned layers of high volume density may also be employed.

Figure 5:
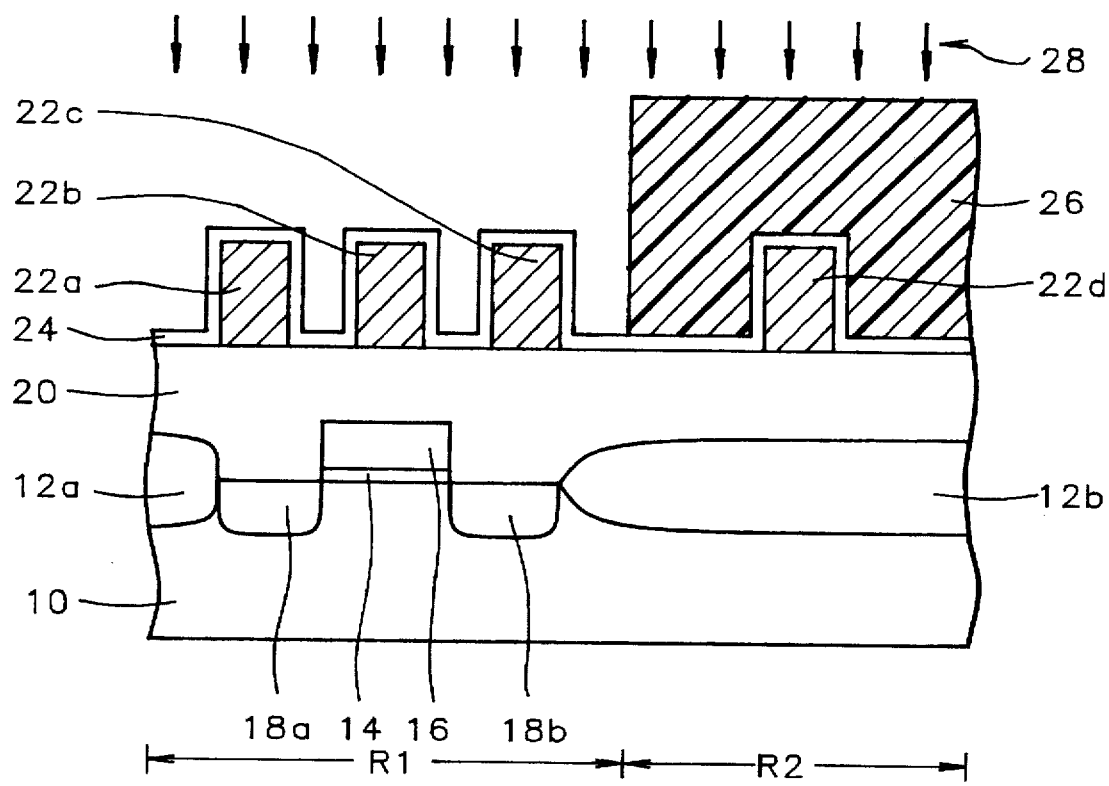

Referring now to FIG. 5 there is shown a schematic cross-sectional diagram illustrating the results of further processing of the integrated circuit whose structure is illustrated in FIG. 4. Shown in FIG. 5 is the presence of a blanket conformal first Inter-Metal Dielectric (IMD) layer 24 which is formed upon the surface of the integrated circuit whose structure is illustrated in FIG. 4. While there are several methods and materials through which blanket conformal Inter-Metal Dielectric (IMD) layers may be formed within integrated circuits, the blanket conformal first Inter-Metal Dielectric (IMD) layer 24 within the first preferred embodiment of the method of the present invention is chosen such that when treated with a first plasma 28 the blanket conformal first Inter-Metal Dielectric (IMD) layer 24 will retard the growth of an insulator layer which is formed upon the surface of the blanket conformal first Inter-Metal Dielectric (IMD) layer 24. Thus, within the first preferred embodiment of the method of the present invention, the choice of the method and material through which is formed the blanket conformal first Inter-Metal Dielectric (IMD) layer 24 is undertaken in conjunction with the choice of the first plasma 28 and a gap filling insulator layer which is subsequently formed upon the blanket conformal first Inter-Metal Dielectric (IMD) layer 24.

Within the first preferred embodiment of the present invention, it has been found experimentally that a blanket conformal first Inter-Metal Dielectric (IMD) layer 24 formed of a silicon oxide deposited through a Plasma Enhanced Chemical Vapor Deposition (PECVD) method employing Tetra Ethyl Ortho Silicate (TEOS) as a silicon source material will inhibit the growth of a gap filling insulator layer formed upon the blanket conformal first Inter-Metal Dielectric (IMD) layer 24 when the blanket conformal first Inter-Metal Dielectric (IMD) layer is treated with an oxygen plasma. It has also been found experimentally that the same inhibiting effect is obtained when the blanket conformal first Inter-Metal Dielectric (IMD) layer 24 is: (1) formed of a silicon oxide deposited through a Plasma Enhanced Chemical Vapor Deposition (PECVD) method employing silane as a silicon source material, and (2) subsequently treated with a first plasma 28 consisting of a nitrogen plasma or an oxygen plasma. It is thus any of the three foregoing combinations of blanket conformal first Inter-Metal Dielectric (IMD) layer 24 and first plasma 28 which provide the preferred combinations of the first preferred embodiment of the method of the present invention.

Preferably, the blanket conformal first Inter-Metal Dielectric (IMD) layer 24 is formed to a thickness of about 500 to about 2000 angstroms at: (1) a semiconductor substrate temperature of from about 380 to about 420 degrees centigrade; (2) a Tetra Ethyl Ortho Silicate (TEOS) flow rate of from about 2 to about 6 standard cubic centimeters per minute (sccm) (or a silane flow rate of from about 80 to about 140 standard cubic centimeters per minute (sccm)); (3) a background helium flow rate (used only when employing Tetra Ethyl Ortho Silicate (TEOS)) of from about 600 to about 1000 standard cubic centimeters per minute; (4) an oxygen (oxidant) flow rate of from about 400 to about 800 standard cubic centimeters per minute (sccm) when employing Tetra Ethyl Ortho Silicate (TEOS) (or a nitrous oxide (oxidant) flow rate of from about 900 to about 300 standard cubic centimeters per minute (sccm) when employing silane); and (5) a reactor chamber pressure of from about 5 to about 10 torr when employing Tetra Ethyl Ortho Silicate (TEOS), or a reactor chamber pressure of from about 1 to about 5 torr when employing silane.

Also shown in FIG. 5 is the presence of a patterned first mask layer 26 which masks the surface of the blanket conformal first Inter-Metal Dielectric (IMD) layer 24 residing in the low areal density region R2. Patterned mask layers, and blanket mask layers from which patterned mask layers are formed, are known in the art of integrated circuit manufacture. Such mask layers are typically, although not exclusively, formed from photoresist materials. For the first preferred embodiment of the method of the present invention, the patterned first mask layer 26 is preferably formed of a photoresist which is impervious to the first plasma 28 which is employed in treating portions of the blanket conformal first Inter-Metal Dielectric (IMD) layer 24 not covered by the patterned first mask layer 26. Preferably, the patterned first mask layer 26 is from about 5000 to about 10000 angstroms thick.

Finally, there is shown in FIG. 5 the presence of the first plasma 28, the composition of which is chosen such that treatment of exposed portions of the blanket conformal first Inter-Metal Dielectric (IMD) layer 24 with the first plasma 28 will retard growth of a first gap filling insulator layer formed upon those portions of the blanket conformal first Inter-Metal Dielectric (IMD) layer 24. As discussed above, it has been found experimentally for the first preferred embodiment of the method of the present invention that the first plasma 28 is preferably: (1) an oxygen plasma when the blanket conformal first Inter-Metal Dielectric (IMD) layer 24 is formed of a silicon oxide formed through a Plasma Enhanced Chemical Vapor Deposition (PECVD) method employing Tetra Ethyl Ortho Silicate (TEOS) as the silicon source material, and (2) either an oxygen plasma or a nitrogen plasma when the blanket conformal first Inter-Metal Dielectric (IMD) layer 24 is formed of a silicon oxide formed through a Plasma Enhanced Chemical Vapor Deposition (PECVD) method employing silane as the silicon source material.

Preferably the oxygen or nitrogen first plasma 28 is formed at: (1) an oxygen or nitrogen flow rate of from about 400 to about 600 standard cubic centimeters per minute (sccm); (2) a reactor chamber pressure of from about 1 to about 2 torr; (3) a semiconductor substrate temperature of from about 100 to about 200 degrees centigrade; and (4) a mixed radio frequency power having a first radio frequency power of from about 40 to about 60 watts at a first radio frequency of 13.56 MHz and a second radio frequency power of from about 420 to about 480 watts at a second radio frequency of 350 kHz. Preferably, the exposed portions of the blanket conformal first Inter-Metal Dielectric (IMD) layer 24 are treated with the oxygen or nitrogen first plasma 28 for a time period of from about 50 to about 70 seconds.

As is understood by a person skilled in the art, other combinations of the blanket conformal first Inter-Metal Dielectric (IMD) layer 24 and the first plasma 28 may be employed to effectuate the desired growth rate inhibiting effect when forming an insulator layer upon the blanket conformal first Inter-Metal Dielectric (IMD) layer 24. Such combinations may include the absence of the blanket conformal first Inter-Metal Dielectric (IMD) layer 24 and the direct treatment of patterned layers such as patterned first conductor layers 22a, 22b and 22c with an appropriate first plasma 28. Without undue experimentation, a person skilled in the art should be able to determine the most appropriate and workable combinations.

Figure 6:
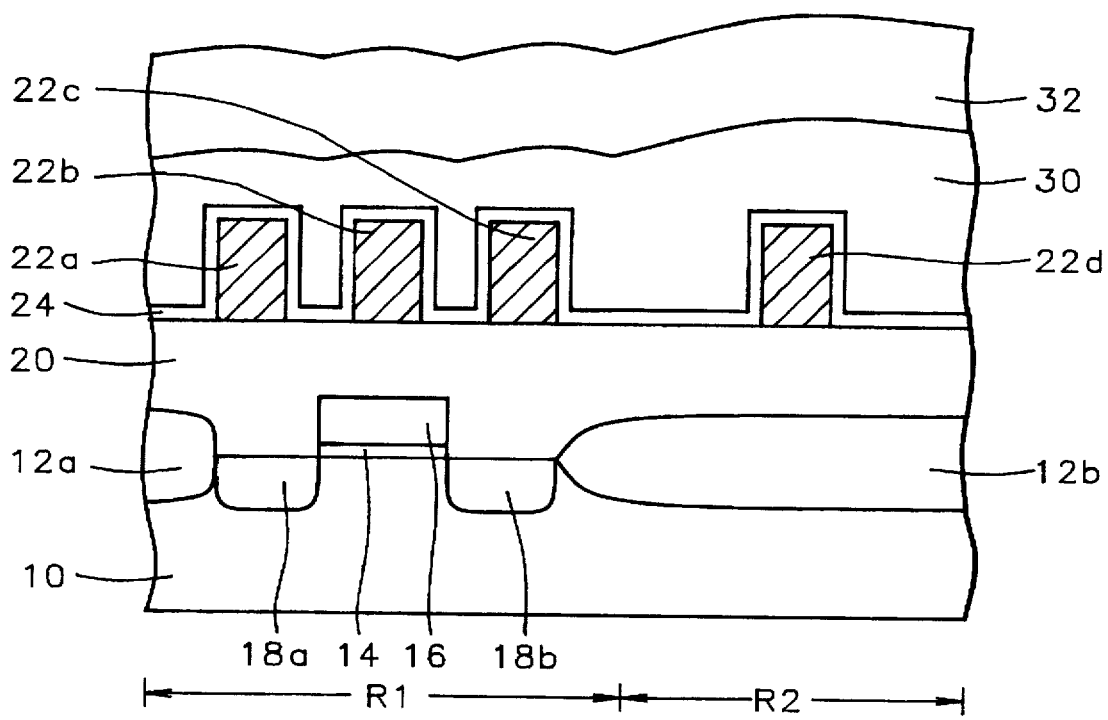

Referring now to FIG. 6, there is shown a schematic cross-sectional diagram illustrating the results of further processing of the integrated circuit whose structure is illustrated in FIG. 5. In order to arrive at the integrated circuit whose structure is illustrated in FIG. 6, the patterned first mask layer 26 is first removed from the integrated circuit whose structure is illustrated in FIG. 5. The patterned first mask layer 26 may be removed through methods as are conventional in the art, including but not limited to solvent stripping methods and Reactive Ion Etch (RIE) etch methods.

Subsequent to removing the patterned first mask layer 26, there is then formed upon the surface of the blanket conformal first Inter-Metal Dielectric (IMD) layer 24 a blanket first gap filling insulator layer 30. The blanket first gap filling insulator layer 30 exhibits a diminished growth rate upon portions of the blanket conformal first Inter-Metal Dielectric (IMD) layer 24 which have been treated with the first plasma 28. For the first preferred embodiment of the method of the present invention, the blanket first gap filling insulator layer 30 is preferably formed from an ozone assisted Chemical Vapor Deposited (CVD) silicon oxide insulator layer employing Tetra Ethyl Ortho Silicate (TEOS) as a silicon source material.

The preferred process parameters under which is formed the blanket first gap filling insulator layer 30 include an ozone:TEOS molar ratio of from about 12:1 to about 16:1, a reactor pressure of from about 450 to about 600 torr, a Tetra Ethyl Ortho Silicate (TEOS) flow rate of from about 27 to about 42 standard cubic centimeters per minute (sccm), a background helium flow of from about 1700 to about 2300 standard cubic centimeters per minute (sccm), a deposition temperature of from about 360 to about 440 degrees centigrade and an oxygen (ozone carrier gas) flow rate of from about 4000 to about 6000 standard cubic centimeters per minute (sccm). Given a typical deposition time of from about 100 to about 240 seconds, the thickness of the blanket first gap filling insulator layer 30 above the patterned first conductor layers 22a, 22b and 22c in the high areal density region R1 will be from about 3000 to about 5000 angstroms, while the thickness of the blanket first gap filling insulator layer 30 above the patterned first conductor layer 22d in the low areal density region R2 will be from about 4000 to about 6000 angstroms.

Finally, there is shown in FIG. 6 the presence of the blanket first conformal Inter-Conductor Dielectric (ICD) layer 32 formed upon the surface of the blanket first gap filling insulator layer 30. It is the blanket first conformal Inter-Conductor Dielectric (ICD) layer 32 which is desired to be uniformly Chemical-Mechanical Polish (CMP) planarized through the method of the present invention. Although blanket conformal Inter-Conductor Dielectric (ICD) layers may in general be formed through several methods and materials, including but not limited to silicon oxide dielectric materials, silicon nitride dielectric materials and silicon oxynitride materials formed through methods including but not limited to Chemical Vapor Deposition (CVD) methods, Plasma Enhanced Chemical Vapor Deposition (PECVD) methods and Physical Vapor Deposition (PVD) sputtering methods, the blanket first conformal Inter-Conductor Dielectric (ICD) layer 32 is preferably formed of a silicon oxide dielectric material formed through a Plasma Enhanced Chemical Vapor Deposition (PECVD) method. The blanket first conformal Inter-Conductor Dielectric (ICD) layer 32 is preferably from about 13000 to about 17000 angstroms thick.

Figure 7:
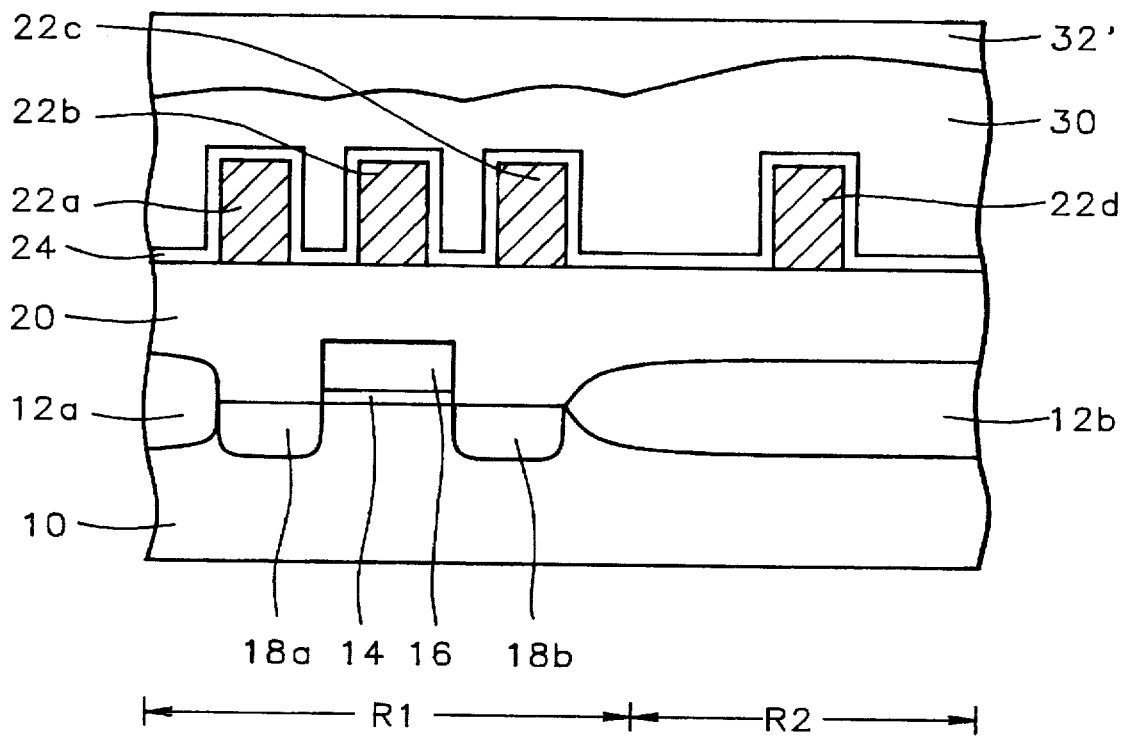

Referring now to FIG. 7 there is shown a schematic cross-section diagram illustrating the results of further processing of the integrated circuit whose structure is illustrated in FIG. 6. Shown in FIG. 7 is a blanket first planarized Inter-Conductor Dielectric (ICD) layer 32' which is formed through Chemical-Mechanical Polish (CMP) planarizing of the blanket first conformal Inter-Conductor Dielectric (ICD) layer 32. For the first preferred embodiment of the method of the present invention, the Chemical-Mechanical Polish (CMP) planarizing is preferably accomplished with a silica slurry through Chemical-Mechanical Polish (CMP) methods as are conventional in the art. The Chemical Mechanical Polish (CMP) planarizing is preferably undertaken at a Chemical Mechanical Polish (CMP) planarizing pressure of from about 7 to about 10 pounds per square inch (psi), a wafer rotation speed of from about 30 to about 50 revolutions per minute (rpm) and a platen (pad) rotation speed of from about 30 to about 50 revolutions per minute (rpm).

As shown in FIG. 7, the blanket first planarized Inter-Conductor Dielectric (ICD) layer 32' is substantially uniform over the high areal density region R1 and the low areal density region R2 of the patterned first conductor layers 22a, 22b, 22c and 22d. The uniformity results from the more rapid Chemical-Mechanical Polish (CMP) planarizing of the thickness of the blanket first conformal Inter-Conductor Dielectric (ICD) layer 32 which resides over the thicker portion of the blanket first gap filling insulator layer 30 in the low areal density region R1. Typically, the blanket first planarized Inter-Conductor Dielectric (ICD) layer 32' is from about 3000 to about 5000 angstroms thick upon completion of the Chemical Mechanical Polish (CMP) planarizing.

As is understood by a person skilled in the art, additional patterned conductor layers, additional blanket conformal Inter-Metal Dielectric (IMD) layers, additional blanket gap filling insulator layers and additional Chemical-Mechanical Polish (CMP) planarized Inter-Conductor Dielectric (ICD) layers may be formed upon the integrated circuit whose structure is illustrated in FIG. 7 to form additional interconnecting layers of the integrated circuit. Shown in FIG. 8 is a schematic cross-sectional diagram which results from such additional layers.

Figure 8:
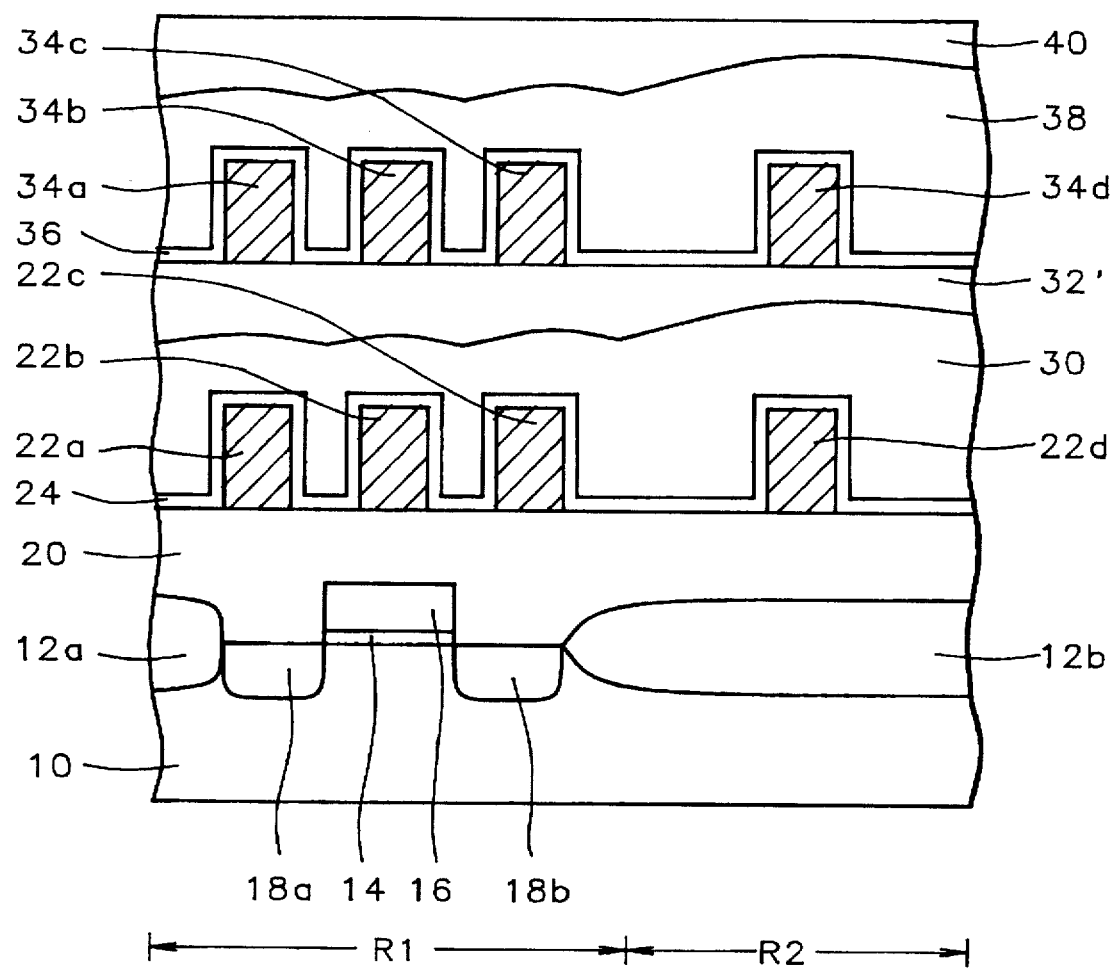

Shown in FIG. 8 is the presence of a set of patterned second conductor layers 34a, 34b, 34c and 34d, a blanket second conformal Inter-Metal Dielectric (IMD) layer 36, a blanket second gap filling insulator layer 38 and a blanket second Chemical-Mechanical Polish (CMP) planarized Inter-Conductor Dielectric (ICD) layer 40. Each of the preceding layers is preferably formed through methods, materials and dimensions equivalent to the methods, materials and dimensions through which are formed the corresponding patterned first conductor layers 22a, 22b, 22c and 22d, the blanket conformal first Inter-Metal Dielectric (IMD) layer 24, the blanket first gap filling insulator layer 30 and the blanket first planarized Inter-Conductor Dielectric (ICD) layer 32' as illustrated in FIG. 7.

Upon forming the integrated circuit structure illustrated in FIG. 8, there is formed an integrated circuit through the first preferred embodiment of the method of the present invention. The integrated circuit so formed has formed therein multiple uniformly Chemical-Mechanical Polish (CMP) planarized blanket Inter-Conductor Dielectric (ICD) layers independent of the areal density of high volume density patterned conductor layers which reside beneath the uniformly Chemical-Mechanical Polish (CMP) planarized blanket Inter-Conductor Dielectric (ICD) layers.

In addition to the first preferred embodiment of the method of the present invention, there also exists a second preferred embodiment of the method of the present invention. The key features of the second preferred embodiment of the method of the present invention, in comparison with the first preferred embodiment of the method of the present invention, are illustrated by reference to FIG. 9 and FIG. 10.

Figure 9:
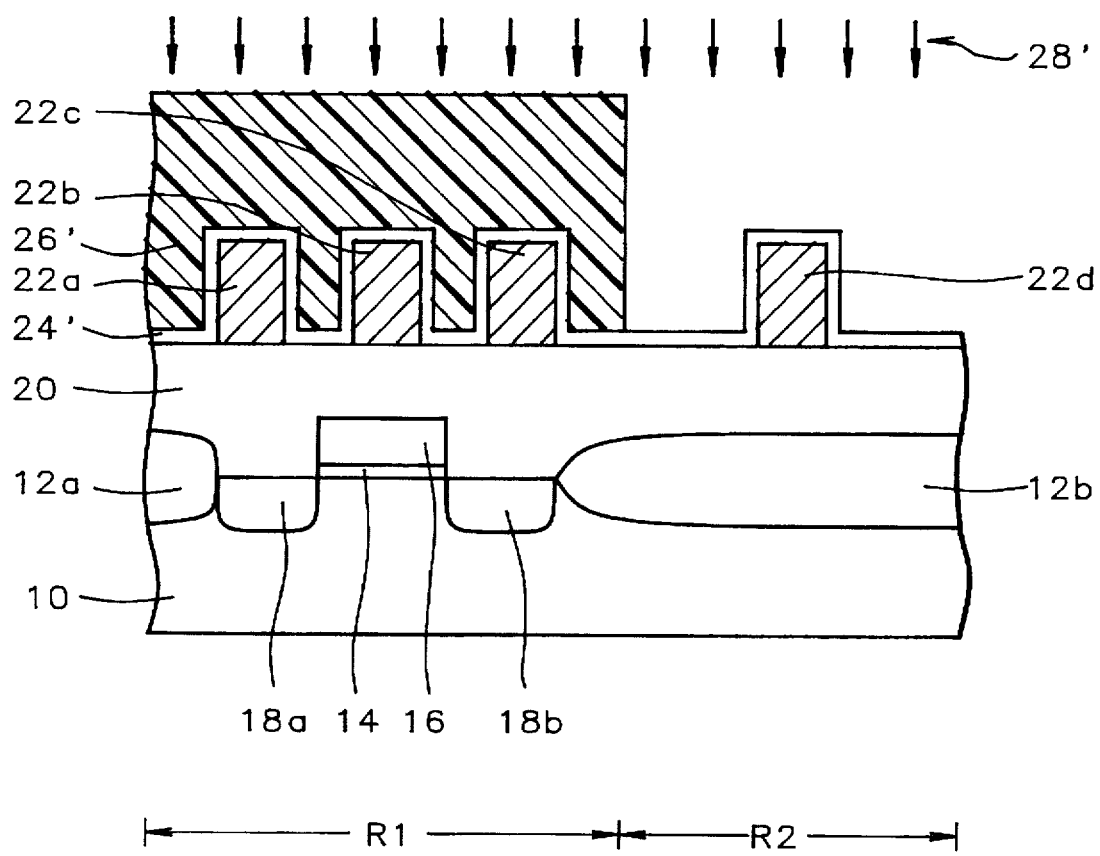
FIG. 9 and FIG. 10 show a pair of schematic cross-sectional diagrams illustrating intermediate process stages in forming an integrated circuit into which is formed a uniformly Chemical-Mechanical Polish (CMP) planarized insulator layer through the second preferred embodiment of the present invention.

Shown in FIG. 9 is a schematic cross-sectional diagram of an integrated circuit similar to the schematic cross-sectional diagram of the integrated circuit illustrated in FIG. 5, with several exceptions. In comparison with the schematic cross-sectional diagram illustrated in FIG. 5, the schematic cross-sectional diagram illustrated in FIG. 9 has a patterned first mask layer 26' which covers a portion of a blanket conformal first Inter-Metal Dielectric (IMD) layer 24' which resides upon the patterned first conductor layers 22a, 22b and 22c within the high areal density region R1. Within FIG. 9, the exposed portion of the blanket conformal first Inter-Metal Dielectric (IMD) layer 24' is treated with a first plasma 28'.

Analogously with the first preferred embodiment of the method of the present invention, the second preferred embodiment of the method of the present invention also requires a specific selection of the method and materials through which are formed the blanket conformal first Inter-Metal Dielectric (IMD) layer 24' and the first plasma 28' such that the growth characteristics of a blanket first gap filling insulator layer upon the blanket conformal first Inter- Metal Dielectric (IMD) layer 24' are modified. However, within the second preferred embodiment of the method of the present invention, the methods and materials through which are formed the blanket conformal first Inter-Metal Dielectric (IMD) layer 24' and the first plasma 28' are chosen such that a blanket gap filling insulator layer, when formed upon the blanket conformal first Inter-Metal Dielectric (IMD) layer 24', will have an enhanced growth rate rather than a retarded growth rate.

It has been found experimentally that the desired growth rate conditions will be fulfilled when: (1) the blanket conformal first Inter-Metal Dielectric (IMD) layer 24' is formed from a silicon oxide dielectric material deposited upon the semiconductor substrate through a Plasma Enhanced Chemical Vapor Deposition (PECVD) method employing Tetra Ethyl Ortho Silicate (TEOS) as the silicon source material, (2) the first plasma is a nitrogen plasma, and (3) the gap filling insulator layer is formed from an ozone assisted Chemical Vapor Deposited (CVD) silicon oxide insulator layer formed under conditions equivalent to the conditions employed in forming the blanket first gap filling insulator layer 30 illustrated in FIG. 6.

Preferably, the blanket conformal first Inter-Metal Dielectric (IMD) layer 24' is formed to a thickness of about 500 to about 2000 angstroms, at a semiconductor substrate temperature of from about 360 to about 440 degrees centigrade, a Tetra Ethyl Ortho Silicate (TEOS) flow rate of from about 2 to about 6 standard cubic centimeters per minute (sccm), a background helium flow rate of from about 600 to about 1000 standard cubic centimeters per minute, an oxygen (oxidant) flow rate of from about 400 to about 800 standard cubic centimeters per minute (sccm), and a reactor chamber pressure of from about 5 to about 10 torr.

Preferably, the nitrogen plasma first plasma 28' is provided at a nitrogen flow rate of from about 400 to about 600 standard cubic centimeters per minute (sccm), a reactor chamber pressure of from about 1 to about 2 torr, a semiconductor substrate temperature of from about 100 to about 200 degrees centigrade and a mixed radio frequency power having a first radio frequency power of from about 40 to about 60 watts at a first radio frequency of 13.56 MHz and a second radio frequency power of from about 420 to about 480 watts at a second radio frequency of 350 kHz. Preferably, the exposed portions of the blanket conformal first Inter-Metal Dielectric (IMD) layer 24' are treated with the nitrogen plasma first plasma 28' for a time period of from about 50 to about 70 seconds.

Analogously with the first preferred embodiment of the method of the present invention, other combinations of blanket conformal first Inter-Metal Dielectric (IMD) layer 24' and first plasma 28' may be employed in providing a blanket conformal first Inter-Metal Dielectric (IMD) layer 24' exhibiting an inhibited growth rate of an insulator layer upon the blanket conformal first Inter-Metal Dielectric (IMD) layer 24'. The combinations may include, but are not limited to, the absence of the blanket conformal first Inter-Metal Dielectric (IMD) layer 24' and the direct treatment of the patterned first conductor layer 22d with the first plasma 28'. A person skilled in the art may determine the most appropriate and workable combinations without undue experimentation.

Figure 10:
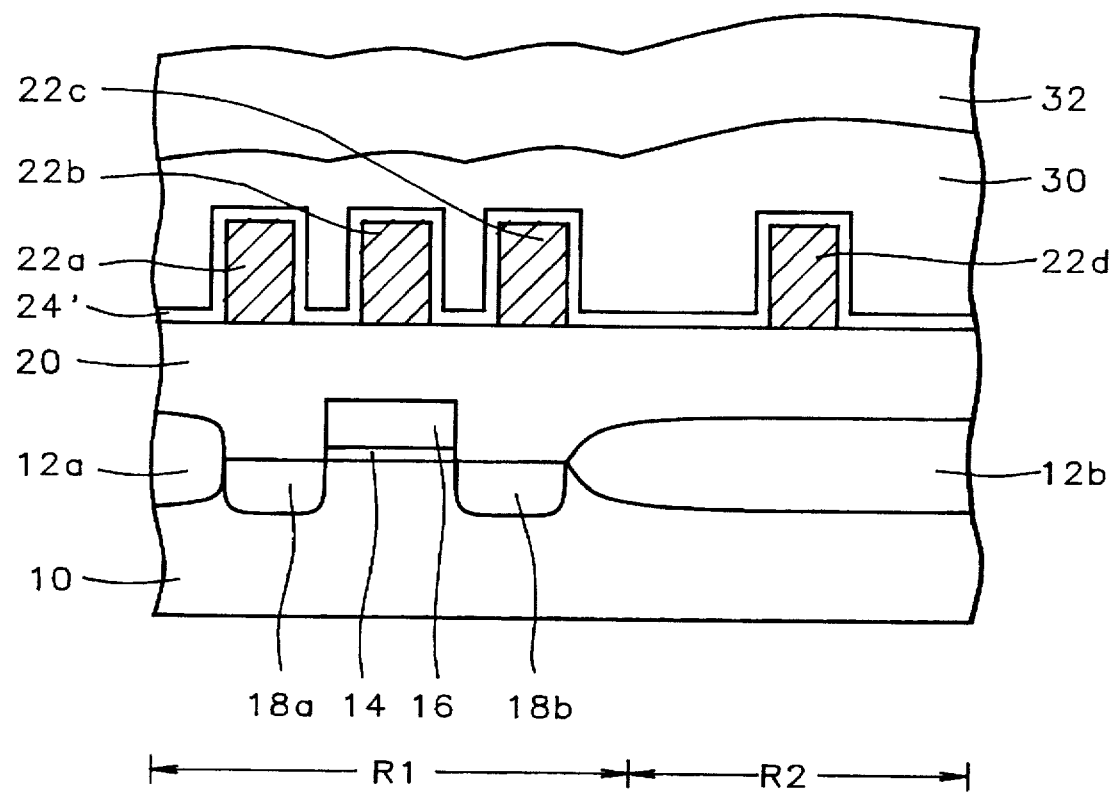
Figure 11:
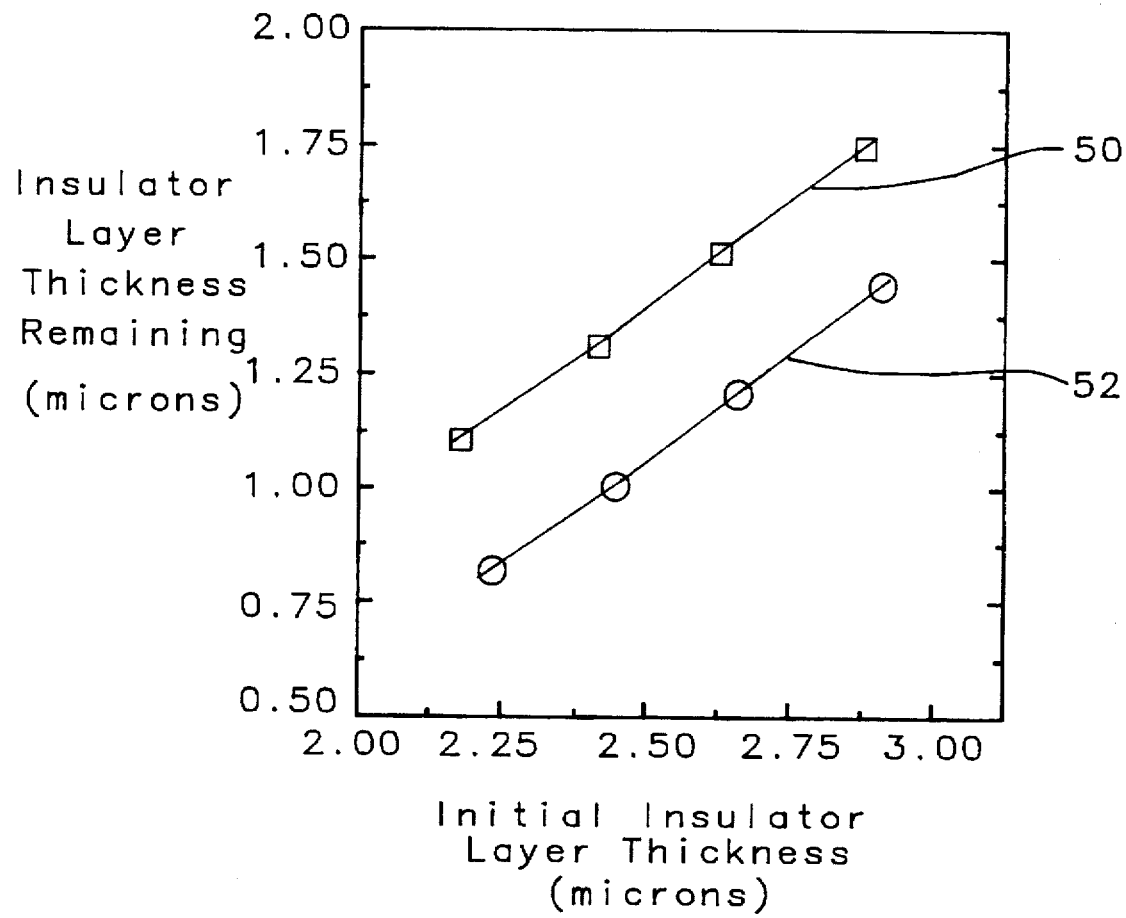
FIG. 11 shows a plot of Insulator Layer Thickness Remaining versus Initial Insulator Layer Thickness for Chemical-Mechanical Polish (CMP) planarizing of insulator layers as described in EXAMPLE 7.

Referring now to FIG. 10 there is shown a schematic cross-sectional diagram illustrating the results of further processing of the integrated circuit whose structure is illustrated in FIG. 9. In order to arrive at the integrated circuit whose structure is illustrated in FIG. 10, the patterned first masking layer 26' is first removed from the integrated circuit whose cross-section is illustrated in FIG. 9. There is then formed upon the integrated circuit a blanket first gap filling insulator layer 30 and a blanket first conformal insulator layer 32 employing methods, materials and thicknesses equivalent to the methods, materials and thicknesses employed in forming the equivalent blanket first gap filling insulator layer 30 and blanket first conformal insulator layer 32 illustrated in FIG. 6. The integrated circuit illustrated in FIG. 10 is otherwise equivalent to the integrated circuit illustrated in FIG. 6, with the exception of the differing methods and materials through which are formed the blanket conformal first Inter-Metal Dielectric layer 24 and the blanket conformal first Inter-Metal Dielectric layer 24'. The integrated circuit whose structure is illustrated in FIG. 10 may be uniformly Chemical Mechanical Polish (CMP) planarized to yield an integrated circuit analogous to the integrated circuit whose structure is illustrated in FIG. 7.

In addition to the first preferred embodiment of the method of the present invention and the second preferred embodiment of the method of the present invention, there also exists a third preferred embodiment of the method of the present invention. The third preferred embodiment of the method of the present invention employs the integrated circuit structure of the second preferred embodiment of the present invention and includes the plasma treatments of both the first preferred embodiment of the method of the present invention and the second preferred embodiment of the method of the present invention. Through the third preferred embodiment of the method of the present invention, there is formed a blanket first conformal Inter-Metal Dielectric (IMD) layer 24' exhibiting a retarded growth rate for a blanket first gap filling insulator layer 30 upon a high areal density region R1 and an enhanced growth rate for the blanket first gap filling insulator 30 layer upon a low areal density region R2. As is understood by a person skilled in the art, the third preferred embodiment of the method of the present invention provides a blanket first gap filling insulator layer exhibiting a greater difference in height between the high areal density region R1 and the low areal density region R2.

EXAMPLES 1–6

Upon the surfaces of three semiconductor substrates were formed blanket silicon oxide insulator coatings of thickness about 2000 angstroms through a Plasma Enhanced Chemical Vapor Deposition (PECVD) method employing Tetra Ethyl Ortho Silicate (TEOS) as a silicon source material. The blanket silicon oxide insulator coatings were formed at a semiconductor substrate temperature of about 400 degrees centigrade, a Tetra Ethyl Ortho Silicate (TEOS) flow rate of about 4 standard cubic centimeters per minute (sccm), a background helium flow rate of about 800 standard cubic centimeters per minute, an oxygen (oxidant) flow rate of about 600 standard cubic centimeters per minute (sccm) and a reactor chamber pressure of about 8 torr.

One of the three wafers then received nitrogen plasma treatment for 60 seconds. The nitrogen plasma was provided at a nitrogen flow rate of about 500 standard cubic centimeters per minute (sccm), a reactor chamber pressure of about 1.5 torr, a semiconductor substrate temperature of about 150 degrees centigrade and a mixed radio frequency power having a first radio frequency power of about 50 watts at a first radio frequency of 13.56 MHz and a second radio frequency power of about 450 watts at a second radio frequency of 350 kHz.

A second of the three wafers then received an oxygen plasma treatment for 60 seconds. The oxygen plasma was provided at an oxygen flow rate of about 500 standard cubic centimeters per minute (sccm), a reactor chamber pressure of about 1.5 torr, a semiconductor substrate temperature of about 150 degrees centigrade and a mixed radio frequency power having a first radio frequency power of about 50 watts at a first radio frequency of 13.56 MHz and a second radio frequency power of about 450 watts at a second radio frequency power of 350 kHz.

The remaining wafer received no plasma treatment.

Upon the surfaces of a second group of three semiconductor substrates were formed blanket silicon oxide insulator coatings of thickness about 2000 angstroms through a Plasma Enhanced Chemical Vapor Deposition (PECVD) method employing silane as a silicon source material. The blanket silicon oxide insulator coatings were formed at a semiconductor substrate temperature of about 400 degrees centigrade, a silane flow rate of about 120 standard cubic centimeters per minute (sccm), a nitrous oxide (oxidant) flow rate of about 1100 standard cubic centimeters per minute (sccm) and a reactor chamber pressure of about 2 torr.

Analogously with the first group of three semiconductor substrates, one semiconductor substrate within the second group received an oxygen plasma treatment, a second semiconductor substrate received a nitrogen plasma treatment and the third semiconductor substrate received no plasma treatment. The conditions under which were provided the nitrogen plasma and the oxygen plasma treatments were equivalent to the conditions employed for the first group of three semiconductor substrates.

Each of the six semiconductor substrates then had formed upon its surface an ozone assisted Chemical Vapor Deposited (CVD) silicon oxide insulator layer, under equivalent conditions. The parameters under which were formed the ozone assisted Chemical Vapor Deposited (CVD) silicon oxide insulator layers were an ozone:TEOS molar ratio of about 14, a reactor pressure of about 450 torr, a Tetra Ethyl Ortho Silicate (TEOS) flow rate of about 35 standard cubic centimeters per minute, a background helium flow of about 2300 standard cubic centimeters per minute, a deposition temperature of about 400 degrees centigrade and an oxygen (ozone carrier gas) flow rate of about 5000 standard cubic centimeters per minute (sccm).

The ozone assisted Chemical Vapor Deposited (CVD) silicon oxide insulator layers were deposited for a time sufficient to form upon the surfaces of the two wafers which received no plasma treatment an ozone assisted Chemical Vapor Deposited silicon oxide insulator layer of about 5000 angstroms. The resulting thicknesses of the ozone assisted Chemical Vapor Deposited (CVD) silicon oxide insulator layers on the remaining four wafers were then measured. The values for the thicknesses of the six ozone assisted Chemical Vapor Deposited (CVD) silicon oxide insulator layers are reported in TABLE I.

TABLE I

| Substrate Layer | Plasma | O3-TEOS Thickness |
|---|---|---|
| PECVD-TEOS | none | 5000 angstroms |
| PECVD-TEOS | oxygen | 3780 |
| PECVD-TEOS | nitrigen | 5500 |
| PECVD-silane | none | 5000 |
| PECVD-silane | oxygen | 3540 |
| PECVD-silane | nitrogen | 4550 |

As is seen from review of the data in TABLE I, the rate of formation of ozone assisted Chemical Vapor Deposited silicon oxide insulator layers upon silicon oxide insulator layers formed through a Plasma Enhanced Chemical Vapor Deposition (PECVD) method employing silane as a silicon source material are retarded when the Plasma Enhanced Chemical Vapor Deposited (PECVD) silicon oxide insulator layer is treated with either a nitrogen or an oxygen plasma.

In contrast, the rate of formation of an ozone assisted Chemical Vapor Deposited (CVD) silicon oxide insulator layer upon a Plasma Enhanced Chemical Vapor Deposited (PECVD) silicon oxide insulator employing Tetra Ethyl Ortho Silicate (TEOS) as a silicon source material is enhanced when the Plasma Enhanced Chemical Vapor Deposited (PECVD) silicon oxide insulator layer is treated with a nitrogen plasma and retarded when the Plasma Enhanced Chemical Vapor Deposited (PECVD) silicon oxide insulator layer is treated with an oxygen plasma.

EXAMPLE 7

A series of four semiconductor substrates was prepared in accord with the first preferred embodiment of the method of the present invention, as illustrated by the schematic cross-sectional diagram shown in FIG. 6. Formed upon the semiconductor substrate was a high areal density region R1 having about 50 percent coverage of the semiconductor substrate surface by a patterned first conductor layer, and a low areal density region R2 having about 30 percent coverage of the semiconductor substrate by the patterned first conductor layer. Upon each of the four semiconductor substrates was then formed an insulator layer. The four insulator layer thicknesses spanned the range of about 2.1 microns to about 2.9 microns. Each of the four insulator layers was then Chemical Mechanical Polish (CMP) planarized with equivalent Chemical Mechanical Polish (CMP) planarizing processes employing a silica polishing slurry at a Chemical Mechanical Polish (CMP) planarizing pressure of about 8 pounds per square inch (psi), a wafer rotation speed of about 40 revolutions per minute (rpm) and a platen (pad) rotation speed of about 40 revolutions per minute (rpm). After the Chemical Mechanical Polish (CMP) planarizing processing, the thicknesses of the four insulator layers were remeasured over the high areal density region R1 and the low areal density region R2. A plot of Insulator Layer Thickness Remaining versus Initial Insulator Layer Thickness is show in FIG. 10.

Within FIG. 10, reference numeral 50 corresponds to the data points obtained from measurements of the insulator layers residing upon the high areal density region R1. Analogously, reference numeral 52 corresponds to the data points obtained from measurements of the insulator layers residing upon the low areal density region R2.

From review of the data plotted within FIG. 10 it is concluded that portions of the insulator layers which were formed upon the low areal density region R2, v, more rapidly in a Chemical-Mechanical Polish (CMP) planarizing process than do otherwise equivalent portions of the insulator layers which reside upon the high areal density region R1 of the same semiconductor substrate.

In conjunction with the data reported for EXAMPLES 1–6 within TABLE I, the data illustrated for EXAMPLE 7 within FIG. 10 support the viability of the preferred embodiments of the method of the present invention in forming uniformly Chemical-Mechanical Polish (CMP) planarized insulator layers within integrated circuits.

What is claimed is:

1. A method for forming an insulator layer with enhanced uniformity when planarized through a Chemical-Mechanical Polish (CMP) planarizing process comprising:

providing a semiconductor substrate;

forming upon the semiconductor substrate a patterned layer, the patterned layer having a volume density greater than the volume density of an insulator layer to be formed upon the patterned layer, the patterned layer also having a first region having a high areal patterning density of the patterned and a second region having a low areal patterning density of the patterned layer;

masking the second region of the patterned layer;

exposing then the first region of the patterned layer to a first plasma, the first plasma being capable of modifying the first region of the patterned layer such that the insulator layer will form less rapidly upon the first region of the patterned layer than upon the second region of the patterned layer;

unmasking the second region of the patterned layer; and, forming upon the patterned layer the insulator layer, the insulator layer being thicker over the second region than over the first region.

2. The method of claim 1 wherein the patterned layer is a patterned conductor layer.

3. The method of claim 2 wherein the difference in areal density of the patterned conductor layer within the first region and within the second region is at least about 10 percent.

4. The method of claim 1 further comprising forming a second insulator layer conformally directly upon the patterned layer prior to exposing the patterned layer to the first plasma, the second insulator layer being formed from a silicon oxide deposited through a Plasma Enhanced Chemical Vapor Deposition (PECVD) method employing Tetra Ethyl Ortho Silicate (TEOS) as a silicon source material.

5. The method of claim 4 wherein the first plasma is an oxygen plasma.

6. The method of claim 1 further comprising forming a second insulator layer conformally directly upon the patterned layer prior to exposing the patterned layer to the first plasma, the second insulator layer being formed from a silicon oxide deposited through a Plasma Enhanced Chemical Vapor Deposition (PECVD) method employing silane as a silicon source material.

7. The method of claim 6 wherein the first plasma is selected from the group of plasmas consisting of oxygen plasmas and nitrogen plasmas.

8. The method of claim 1 wherein:

the first plasma is provided at a mixed radio frequency power having a first radio frequency power of from about 40 to about 60 watts at a first radio frequency of 13.56 MHz and a second radio frequency power of from about 420 to about 480 watts at a second radio frequency of 350 kHz; and the first plasma is provided for a time period of from about 50 to about 70 seconds.

9. The method of claim 1 wherein the insulator layer is an ozone assisted Chemical Vapor Deposited (CVD) silicon oxide insulator layer.

10. The method of claim 9 wherein the ozone assisted Chemical Vapor Deposited (CVD) silicon oxide insulator layer employs Tetra Ethyl Ortho Silicate (TEOS) as a silicon source material at an ozone:TEOS molar ratio of from about 12:1 to about 16:1.

11. A method for forming an insulator layer with enhanced uniformity when planarized through a Chemical-Mechanical Polish (CMP) planarizing process comprising:

providing a semiconductor substrate;

forming upon the semiconductor substrate a patterned layer, the patterned layer having a volume density greater than the volume density of an insulator layer to be formed upon the patterned layer, the patterned layer also having a first region having a high areal patterning density of the patterned layer and a second region having a low areal patterning density of the patterned layer;

masking the first region of the patterned layer;

exposing then the second region of the patterned layer to a second plasma, the second plasma being capable of modifying the second region of the patterned layer such that the insulator layer will form more rapidly upon the second region of the patterned layer than upon the first region of the patterned layer;

unmasking the first region of the patterned layer; and, forming upon the patterned layer the insulator layer, the insulator layer being thicker over the second region than over the first region.

12. The method of claim 11 wherein the patterned layer is a patterned conductor layer.

13. The method of claim 12 wherein the difference in areal density of the patterned conductor layer within the first region and within the second region is at least about 10 percent.

14. The method of claim 11 further comprising forming a second insulator layer conformally directly upon the patterned layer prior to exposing the patterned layer to the second plasma, the second insulator layer being formed from a silicon oxide deposited through a Plasma Enhanced Chemical Vapor Deposition (PECVD) method employing Tetra Ethyl Ortho Silicate (TEOS) as a silicon source material.

15. The method of claim 14 wherein the second plasma is a nitrogen plasma.

16. The method of claim 15 wherein:

the nitrogen plasma is provided at a mixed radio frequency power having a first radio frequency power of from about 40 to about 60 watts at a first radio frequency of 13.56 MHz and a second radio frequency power of from about 420 to about 480 watts at a second radio frequency of 350 KHz; and the nitrogen plasma is provided for a time period of from about 50 to about 70 seconds.

17. The method of claim 11 wherein the insulator layer is an ozone assisted Chemical Vapor Deposited (CVD) silicon oxide insulator layer.

18. The method of claim 17 wherein the ozone assisted Chemical Vapor Deposited (CVD) silicon oxide insulator layer employs Tetra Ethyl Ortho Silicate (TEOS) as a silicon source material at an ozone:TEOS molar ratio of from about 12:1 to about 16:1.

19. A method for forming an insulator layer with enhanced uniformity when planarized through a Chemical-Mechanical Polish (CMP) planarizing process comprising:

providing a semiconductor substrate;

forming upon the semiconductor substrate a patterned layer, the patterned layer having a volume density greater than the volume density of an insulator layer to be formed upon the patterned layer, the patterned layer also having a first region having a high areal patterning density of the patterned layer and a second region having a low areal patterning density of the patterned layer;

masking the second region of the patterned layer and exposing then the first region of the patterned layer to a first plasma, the first plasma being capable of modifying the first region of the patterned layer such that the insulator layer will form less rapidly upon the first region of the patterned layer than upon the second region of the patterned layer;

unmasking the second region of the semiconductor substrate;

masking the first region of the patterned layer and exposing then the second region of the patterned layer to a second plasma, the second plasma being capable of modifying the second region of the patterned layer such that the insulator layer will form more rapidly upon the second region of the patterned layer than upon the first region of the patterned layer;

unmasking the first region of the semiconductor substrate; and, forming then upon the patterned layer the insulator layer, the insulator layer being thicker over the second region than over the first region.

20. The method of claim 19 wherein the patterned layer is a patterned conductor layer, the patterned conductor layer having a difference in areal density within the first region and within the second region of at least about 10 percent.

21. The method of claim 19 further comprising forming a second insulator layer conformally directly upon the patterned layer prior to exposing the patterned layer to the first plasma and the second plasma, the second insulator layer being formed from a silicon oxide deposited through a Plasma Enhanced Chemical Vapor Deposition (PECVD) method employing Tetra Ethyl Ortho Silicate (TEOS) as a silicon source material.

22. The method of claim 21 wherein the first plasma is an oxygen plasma and the second plasma is a nitrogen plasma.

23. The method of claim 22 wherein:

the oxygen plasma is provided at a mixed radio frequency power having a first radio frequency power of from about 40 to about 60 watts at a first radio frequency of 13.56 MHz and a second radio frequency power of from about 420 to about 480 watts at a second radio frequency of 350 kHz;

the oxygen plasma is provided for a time period of from about 50 to about 70 seconds;

the nitrogen plasma is provided at a mixed radio frequency having a first radio frequency power of from about 40 to about 60 watts at a first radio frequency of 13.56 Mhz and a second radio frequency power of from about 420 to about 480 watts at a second radio frequency of 350 kHz; and the nitrogen plasma is provided for a time period of from about 50 to about 70 seconds.

24. The method of claim 19 wherein the insulator layer is an ozone assisted Chemical Vapor Deposited (CVD) silicon oxide insulator layer.

25. The method of claim 24 wherein the ozone assisted Chemical Vapor Deposited (CVD) silicon oxide insulator layer employs Tetra Ethyl Ortho Silicate (TEOS) as a silicon source material at an ozone:TEOS molar ratio of from about 12:1 to about 16:1.

* * * * *